United States Patent [19]

Yabe

[11] Patent Number: 4,975,854
[45] Date of Patent: Dec. 4, 1990

[54] METHOD OF IMPROVING A PLACEMENT IN LAYOUT DESIGN

[75] Inventor: Shoji Yabe, Tokyo, Japan
[73] Assignee: NEC Corporation, Tokyo, Japan
[21] Appl. No.: 53,013
[22] Filed: May 22, 1987
[30] Foreign Application Priority Data
  May 23, 1986 [JP] Japan ................................ 61-118924
[51] Int. Cl.$^5$ ............................................ G06F 15/60
[52] U.S. Cl. .................................. 364/491; 364/490; 364/489; 364/488
[58] Field of Search ................ 364/300, 488, 489, 490, 364/491

[56] References Cited

U.S. PATENT DOCUMENTS

| | | | |
|---|---|---|---|
| 3,617,714 | 11/1971 | Kernighan et al. | 364/300 |
| 4,577,276 | 3/1986 | Dunlop et al. | 364/491 |
| 4,593,363 | 6/1986 | Burstein et al. | 364/491 |
| 4,613,941 | 9/1986 | Smith et al. | 364/490 |
| 4,630,219 | 12/1986 | DiGiacomo et al. | 364/488 |
| 4,686,629 | 8/1987 | Noto et al. | 364/491 |
| 4,858,143 | 8/1989 | Fournier | 364/491 |

OTHER PUBLICATIONS

22nd ACM/IEEE Design Automation Conference (6/23-26, 1985), 1985 Proceedings, The Institute of Electrical and Electronics Engineers, Table of Contents, and pp. 443-448.
VLSI Design, Apr. 1984, vol. V, pp. 3, 35-36, 38-40 and 42-43, Jerry Werner-Editor in Chief.

Primary Examiner—Parshotam S. Lall
Assistant Examiner—V. N. Trans
Attorney, Agent, or Firm—Foley & Lardner, Schwartz, Jeffery, Schwaab, Mack, Blumenthal & Evans

[57] ABSTRACT

A location method in a layout design improves the efficiency of wiring connections among elements. For each row of cell units, the number of cells in variable length blocks and the number of terminals in each block are identified. After counting the available empty cells, the number of empty cells required by each block is calculated based on the number of cells and terminals in the block. For ech row of cells the empty cells are distributed to the blocks. The blocks are then located accordingly on the base structure.

11 Claims, 7 Drawing Sheets

FIG. 5A

TABLE 23

| BLOCK NAME | EMPTY CELL NUMBER | REQUIRED CELL NUMBER | EXCESS AND DEFICIENCY OF REQUIRED EMPTY CELL NUMBER | LEFT END EMPTY CELL NUMBER |
|---|---|---|---|---|
| A | 1 | 2 | -1 | |
| B | 0 | 1 | -1 | 2 |
| C | 1 | 1 | 0 | |

TABLE 25

| BLOCK NAME | EMPTY CELL NUMBER | REQUIRED CELL NUMBER | EXCESS AND DEFICIENCY OF REQUIRED EMPTY CELL NUMBER | LEFT END EMPTY CELL NUMBER |
|---|---|---|---|---|
| A | 2 | 2 | 0 | |
| B | 0 | 1 | -1 | 1 |
| C | 1 | 1 | 0 | |

TABLE 27

| BLOCK NAME | EMPTY CELL NUMBER | REQUIRED CELL NUMBER | EXCESS AND DEFICIENCY OF REQUIRED EMPTY CELL NUMBER | LEFT END EMPTY CELL NUMBER |
|---|---|---|---|---|
| A | 2 | 2 | 0 | |
| B | 1 | 1 | 0 | 0 |
| C | 1 | 1 | 0 | |

METHOD OF IMPROVING A PLACEMENT IN LAYOUT DESIGN

BACKGROUND OF THE INVENTION

The present invention relates to a method of improving a placement to be used in a layout design of such as a printed wiring board or a very large scale integrated circuit (VLSI) chip.

The term "layout design" generally means to place blocks according to a logic connection and interconnect the blocks. A layout design result is obtainable upon mutual influences between a certain wiring result and other wiring results. Therefore, an evaluation of a placement result is performed by taking a routability into consideration.

As methods related to an automatic routing, a channel router, a line-search and a maze router are well known. For details of these methods, reference is made to an article by Gary Robson titled "Automatic Placement and Routing of Gate Arrays", VLSI DESIGN, vol. 5, No. 4, April issue, 1984, pp. 35 to 43 (Reference 1).

In the channel router, among others, wirings penetrate channels vertically and, therefore, it is necessary to preliminarily determine positions at which the wirings penetrate the channels. In order to realize this, a vertical assignment is performed initially. Another method in which wiring routes are roughly determined prior to the vertical assignment and the line search, i.e., the so-called a global router, is also well known.

Examples of wirings according to the methods are disclosed in an article by C. P. Hsu et al titled "ALPS2 A Standard Cell Layout System for Double-Layer Metal Technology" in the preliminary papers of the 22nd ACM/IEEE DESIGN AUTOMATION CONFERENCE held in June 23 to 26, 1985 (Reference 2).

In the proposed system, wiring routes are roughly determined by the global routing after a placement and then cross points of the respective wirings and cell columns are obtained by the vertical assignment. Then, the "One-dimensional Placement Improvement" method described on page 445 in Reference 2 is performed again and the wirings are performed by using the channel router thereafter.

In the "One-dimensional Placement Improvement", one of the cell rows is considered and blocks in that row are swapped by taking channel density, routability and wire length into consideration. Then, the cross location between the wirings and the cell rows are obtained again by using a method similar to the Vertical Assignment. This procedure is performed for all cell rows.

In this method, however, the cross location between the cell rows and the wirings determined by the initial "Vertical assignment" such that the vertical line connecting the cross locations is as straight as possible are modified by the "One-dimensional Placement Improvement". Even if such correction is performed by a similar method to the "Vertical Assignment", it is impossible to consider a balance as a whole in this stage because the certain cell row is considered and thus there is a tendency of distortion of wiring. Therefore, the wiring which penetrates vertically may be zig-zagged at a time when the channel router is applied finally, resulting in a necessity of extra wiring area.

SUMMARY OF THE INVENTION

One object of the present invention is therefore, to provide a location improving method for use in a layout design, which can eliminate the disadvantages inherent to the prior art methods.

According to the present invention, there is provided a method, which comprises the steps of:
  inputting the number of cells in a block of a cell row and the number of pins or terminals of the block;
  counting the number of empty cells in the cell row;
  calculating the number of required empty cells on the basis of the number of the empty cells, the number of the cells in the block and the number of the terminals and calculating excess and deficiency of the number of the required empty cells on the basis of the calculated required empty cell number and the empty cell number;
  distributing the blocks to correct the excess and deficiency; and
  relocating the blocks distributed in a base structure of an LSI model or a printed circuit board model.

BRIEF DESCRIPTION OF THE DRAWINGS

The features and advantages of the present invention will be described in greater detail with reference to the accompanying drawings wherein:

FIGS. 5A, 5B and 5C show contents of tables shown in FIG. 4;

In these figures, same reference numerals depict same or corresponding structural elements, respectively.

DETAILED DESCRIPTION OF THE INVENTION

The present invention will now be described in detail with reference to the drawings.

A master slice type large scale integrated circuit (referred to as LSI hereinafter) model. However, it should be noted that the present invention is applicable to other integrated circuit designs equally.

Figure 1:
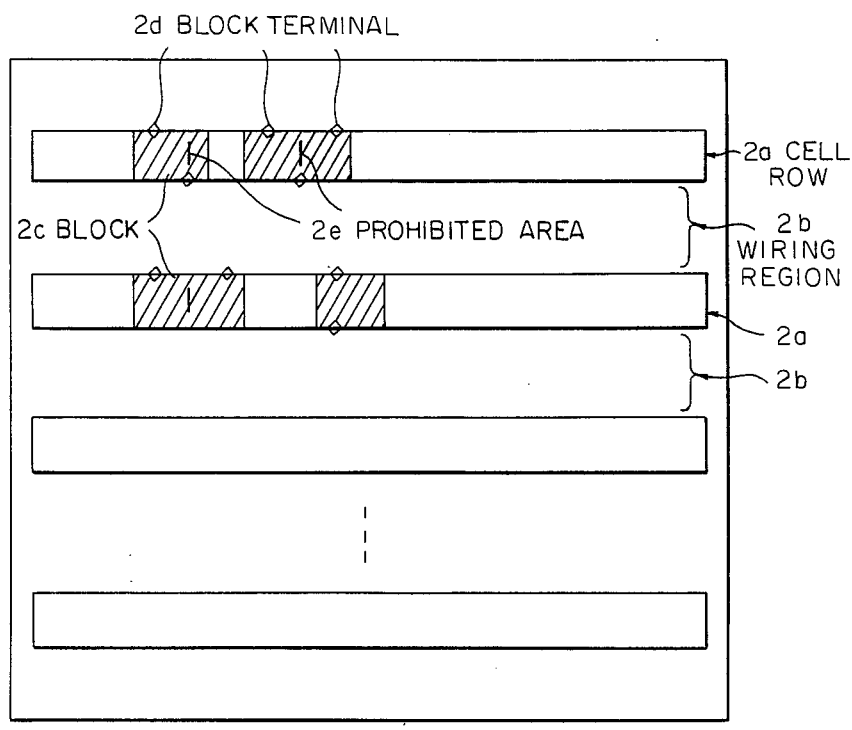
FIG. 1 illustrates an example of a base structure of an LSI model.

Referring to FIG. 1, a plurality of cell rows $2a$ in which a plurality of blocks to be located are arranged on a base structure of the LSI model. The blocks $2c$ are placed on each of the cell row $2a$. The size of the blocks $2c$ may be different from each other and is represented by an integer multiplication of a cell which is a basic unit of the cell row $2a$. An area between adjacent cell rows $2a$ is referred to as a wiring area $2b$. The wiring is performed on a wiring grid by using a first and second layers of the LSI model. The wiring grid is defined by pitch having unit value corresponding to a minimum space satisfying the design rule between adjacent wirings. The lateral wiring on the first layer model is performed by using the wiring area $2b$ and the longitudinal wiring on the second layer model is performed across the cell rows 2a. The longitudinal wires can not pass over the block terminals model 2d and the prohibition areas 2e of the blocks to prevent short-circuit between them and wirings at the block terminals model 2d and in the prohibition areas 2e. Therefore, an embodiment of the present invention resides in a method of a relocation of the blocks by moving the block terminals model 2d and the prohibition areas 2e in the blocks so that an effective wiring is realized.

Figure 2:
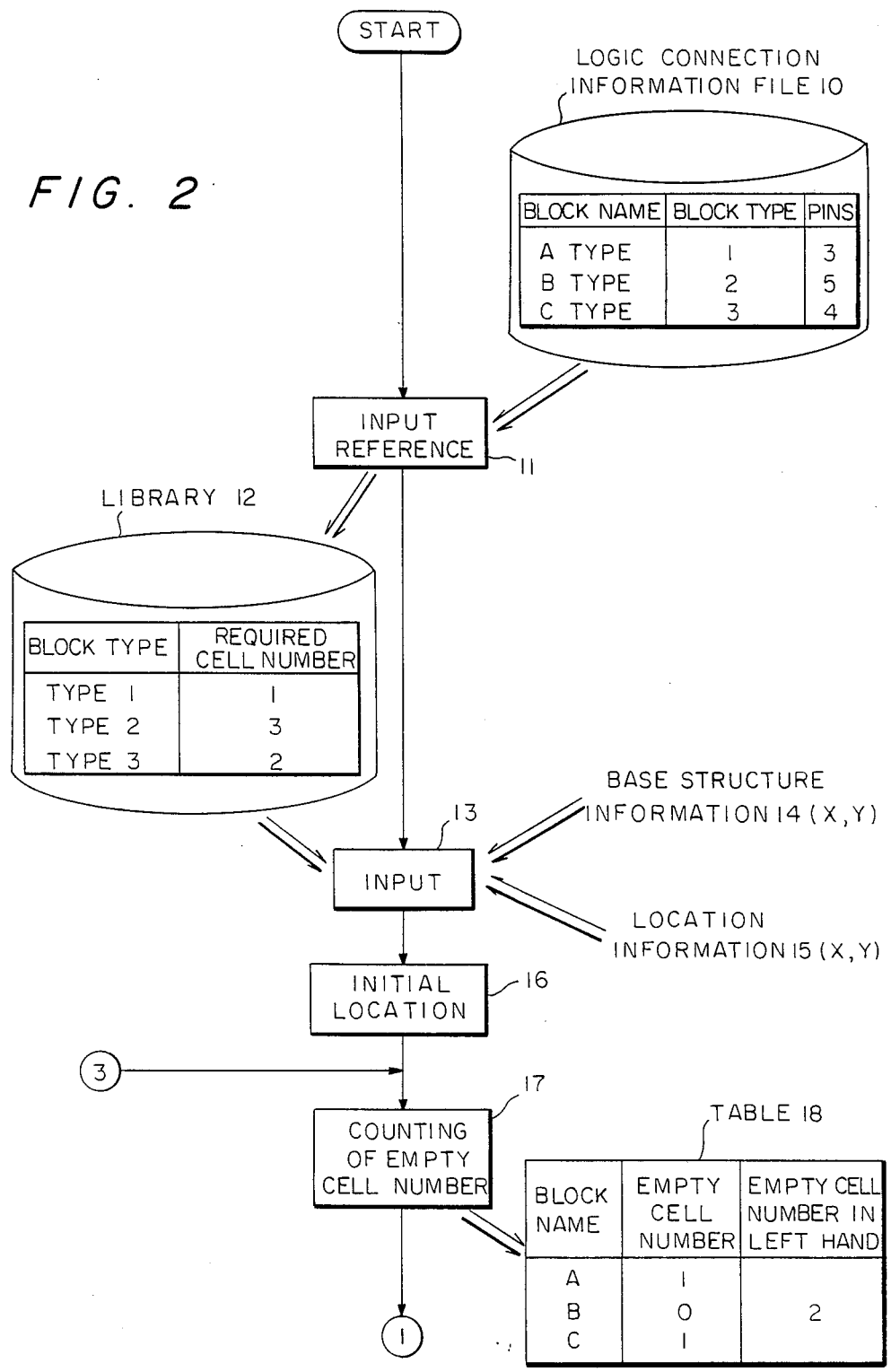
FIGS. 2, 3 and 4 are flow charts showing an embodiment of the present invention.
Figure 3:
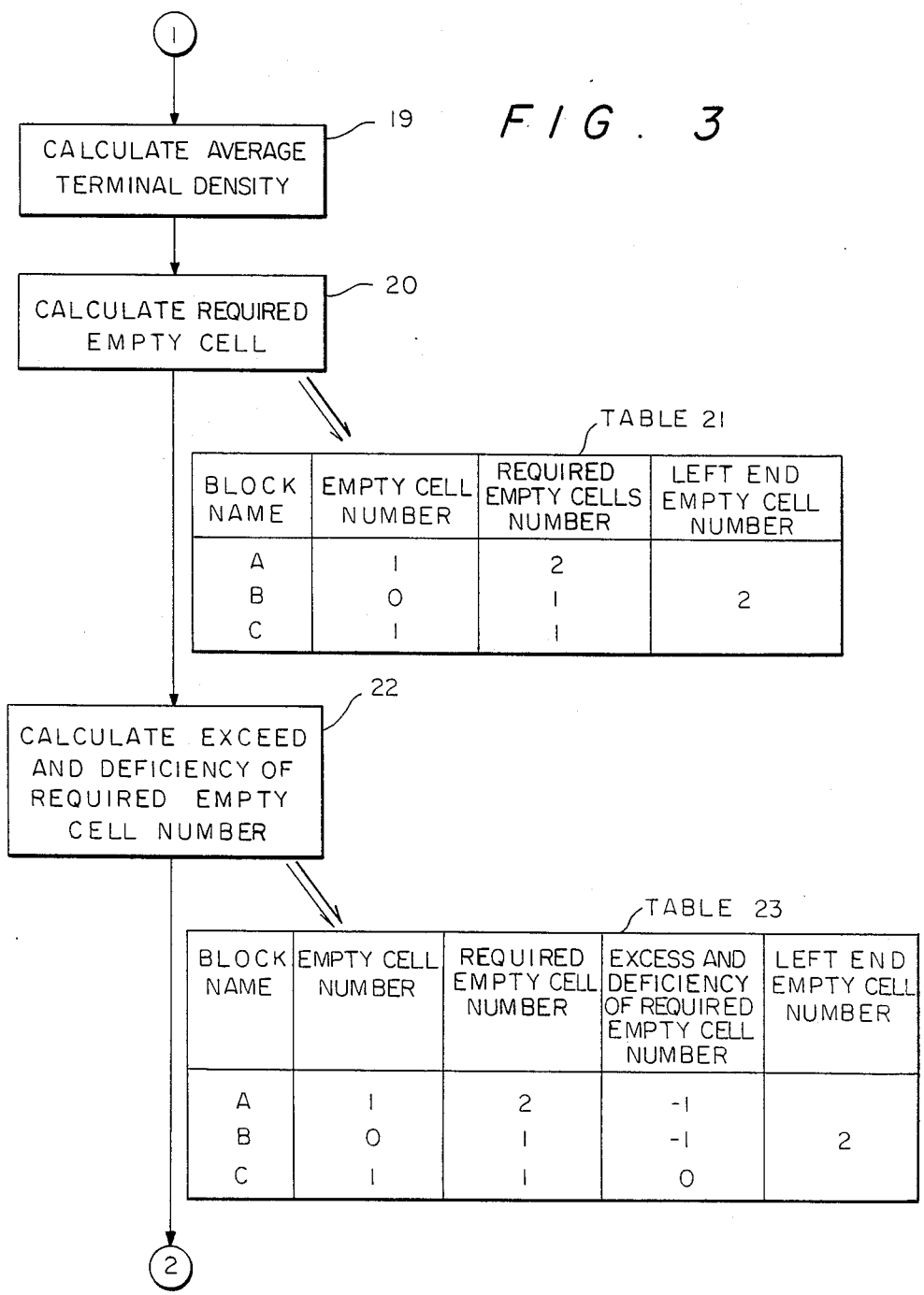
Figure 4:
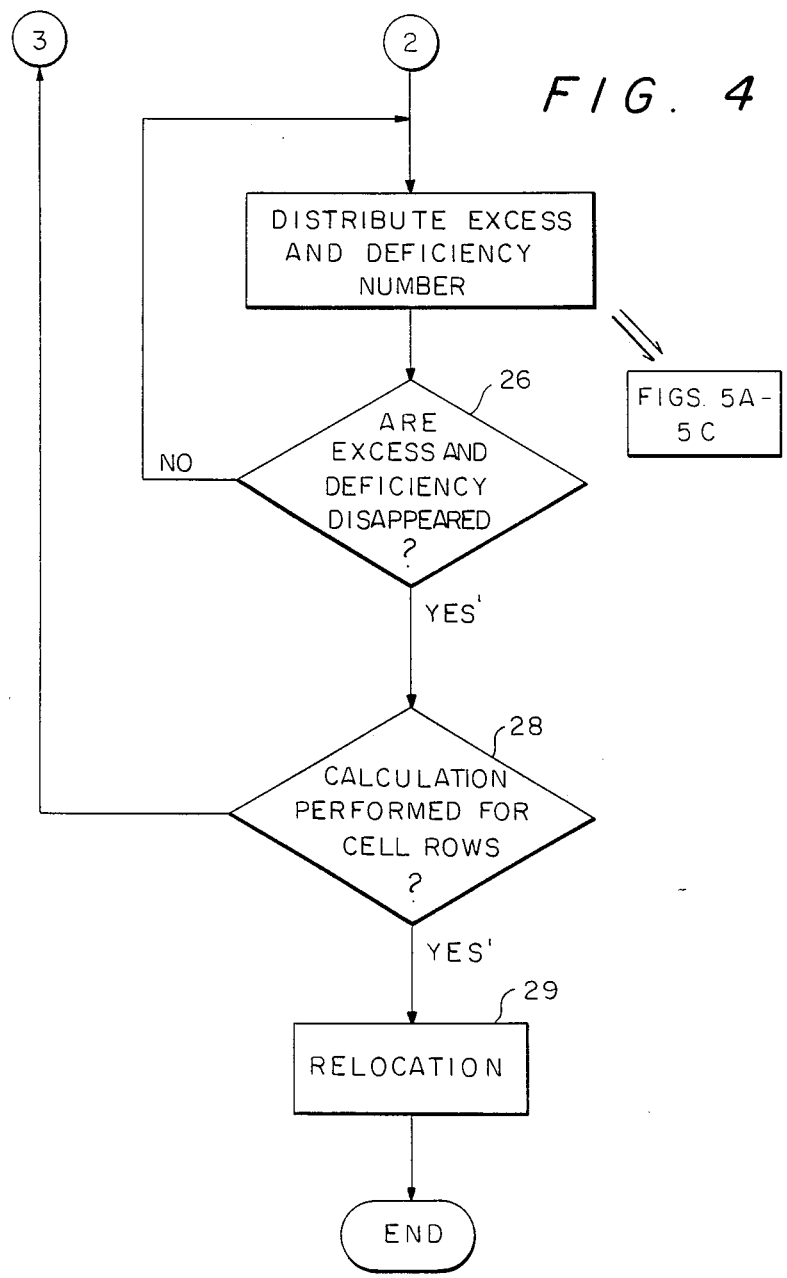

Referring to FIGS. 2, 3 and 4, the embodiment of the invention comprises the step 11 for reading out informations of block names, block types and pins to be used as a set from a logic connection information file 10 and referencing a library 12, the step 13 for reading out the number of required cells from the library 12 referred in the step 11 with respect to the block type information and reading out an externally supplied a base structure information 14 and a location information 15 both represented by X, Y coordinates, the step 16 for performing an initial location, the step 17 for counting empty cells and referencing a table 18, the step 19 for calculating an average terminal density, the step 20 for counting the required empty cells and referencing a table 21, the step 22 of calculating an excess and deficiency of the required empty cells number and referring to a table 23, the step 24 for distributing the excess and deficiency number and referencing tables 23, 25 and 27 shown in FIGS. 5A, 5B and 5C, the step 26 for determining whether or not the excess and deficiency are disappeared, the step 28 for determining whether or not the calculation was performed for all cell rows and the step 29 for relocation.

Figure 6A:
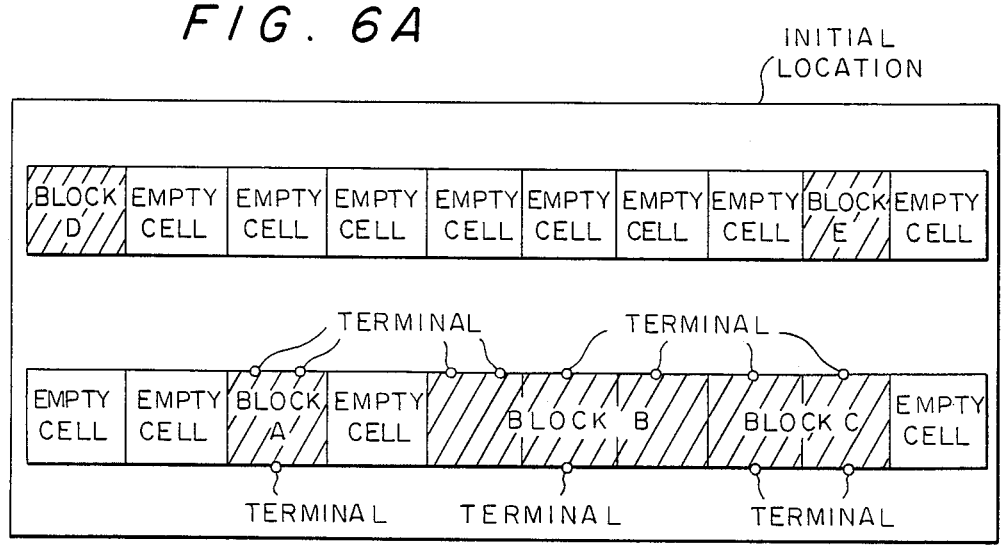
FIGS. 6A and 6B illustrate an example of relocation of blocks.

Referring to FIG. 6A, as a result of the initial location performed in the step 11 in FIG. 2, two empty cells, a block A, an empty cell, a block B including three cells, a block C including two cells and an empty cell are placed in the order from a left end of the lowermost cell row 2a. In a cell row just above the lowest cell row 2a, a block D, seven empty cells, a block E and an empty cell are placed in the order from the left end thereof. In order to calculate the number of the empty cells, a two dimensional table corresponding to the cell structure is prepared for storing in every cell whether or not blocks are placed therein and the calculation is performed by referencing the content of the table.

Referring to FIG. 2 again, the number of the empty cells in the lowermost cell row 2a is counted in the count step 17. The counting result is stored in the table 18. In the counting of the empty cells, the respective blocks, for example, are used as a reference. The number of the empty cells existing in the right side of the respective block is counted. In this counting method, it is impossible to indicate the counted number of the empty cells in the left end. Therefore, a specific item is provided in the table 18. In the case of the lowermost cell row 2a, the empty cell number in the right side of the block A is "1", the cell number in the right side of the block B is "0" and the empty cell number in the right side of the block C is "1". Thus the left side empty cell number is "2".

Referring to FIG. 3, in the calculation step 19, the average terminal density is calculated according to the following equation (1).

$$\text{Average Terminal Density} = \frac{\text{(Total number of Terminals in a Specific cell row)}}{\text{(Total Number of Cells in the Specific cell row)}} \quad (1)$$

The total number of terminals in the lowest cell row is "12" and the total number of cells in the same cell row is "10", in this example. Therefore, the average terminal density becomes "1.2".

In the calculation step 20, the number of required empty cells is calculated according to the following equation (2).

$$\begin{array}{l}\text{Number of} \\ \text{Required Empty Cells}\end{array} = \begin{array}{l}\text{(Number of terminals in the block)/} \\ \text{(Average Terminal density)} - \\ \text{(Number of Cells in the Block)}\end{array} \quad (2)$$

In this example, the number of required empty cells of the block A is $3/1.2-1=2$ and those of the blocks B and C are $5/1.2-3=1$ and $4/1.2-2=1$, respectively. In these calculations, fractions of 5 or over in digits down from decimal point are counted as unit and the rest is disregarded.

These values are stored in locations of the table 21 corresponding to the block names and the numbers of the required empty cells.

Then, in the calculation step 22, the excess and deficiency of the required empty cell number is calculated according to the following equation (3).

$$\begin{array}{l}\text{Excess and Deficiency} \\ \text{of Required Empty Cells}\end{array} = \begin{array}{l}\text{(Number of Empty Cells)} - \\ \text{(Number of Required Cells)}\end{array} \quad (3)$$

In this example, the excess and deficiency of the block A is $1-2=-1$ and those of the blocks B and C are $0-1=-1$ and $1-1=0$, respectively. The results of the calculations are stored in storage locations of the table 23 corresponding to the block names, respectively.

Referring to FIG. 4, a distribution of the excess and deficiency calculated in the step 22 is performed in the distribution step 24. The distribution operation will be described in detail with reference to FIGS. 5A to 5C.

In FIG. 5A, the values calculated in the step 22 are are stored in the table 23. Among others, the distribution is firstly performed by taking the blocks A and B into consideration. In the block A, there is a deficiency of one required empty cell. Therefore, the empty cell number "1" in the table 23 is added by "1" to make it "2". Since the blocks B and C have no extra empty cell, it is impossible to fill it with an empty cell derived therefrom. Therefore, the empty cell at the left end is used therefor, i.e., the empty cell number "2" at the left end of the table 23 is subtracted by "1", resulting in "1" as shown in FIG. 5B.

In FIG. 5B, the result of this distribution is stored in the table 25. As a result, the excess and deficiency for the blocks A and C disappears. However, as to the block B, there is still a required empty cell deficiency of "1". In FIG. 4, it is decided in the step 26 whether or not the excess and deficiency of required empty cells disappears. Since the excess and deficiency is still existing in the block B, a distribution is performed again in the step 24.

In FIGS. 5B to 5C, the deficiency of one required empty cell of the block B is compensated by the empty cell number "1" at the left end. As a result, the empty cell number "0" in the block B is added by a value "1", resulting in "1" as shown in FIG. 5C. As shown in FIGS. 4 and 5C, there is no excess and deficiency for the blocks A, B and C in the table 27. Therefore, in the step 26, it is decided that there is no excess and deficiency of the required empty cell. In the step 28, the steps 17, 19, 20, 22, 24 and 26 are repeated for the respective cell rows until a completion of calculation for all of the cell rows is determined in the step 28. When the completion of calculation is determined in the step 28, a relocation is performed in the step 29.

The relocation will be described in detail hereinafter.

For simplicity of explanation, the relocation for the lowest cell row will be described in detail. However, the relocations for other cell rows ca be performed in the same manner.

Figure 6B:
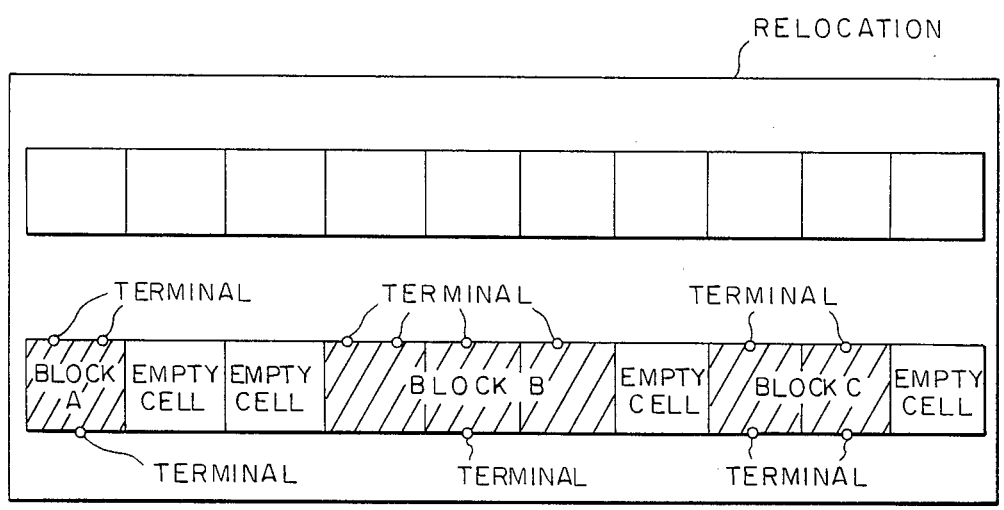

In FIGS. 5C and 6B, since the empty cell number at the left end of the block A is "0", the block A is located at the left end cell. The empty cell number in the table 27 indicates how many empty cells are to be located in the right side of the block A. Therefore, in this example, a couple of empty cells are relocated in the right side of the block A. After this, the block B is located. An empty cell is then relocated in the right side of the block B according to the empty cell number in the table 27. Thereafter, the block C is located. Thus, there is an empty cell in the right side thereof.

When the relocation for this cell row completes, a relocation for the next cell row is started. The blocks D and E shown in FIG. 6A are centered. The procedure for this is the same as that shown in FIGS. 2 to 5 and described hereinbefore.

A model relocated in this manner can be fabricated by using the usual LSI fabricating technique after the Global Routing and the Vertical Assignment disclosed in the article 1. This fabricating technique is disclosed in "2 INTEGRATED SYSTEM FABRICATION", pages 38 to 45 of "INTRODUCTION TO LSI SYSTEM" published in October 1980 by Addison-Wesley publishing company Inc.

Referring to FIGS. 6A and 6B, the blocks A and B are shifted leftwardly by distances corresponding to two cells and One cell, respectively, in the relocation with respect to the initial location.

Figures 7A, 7B:
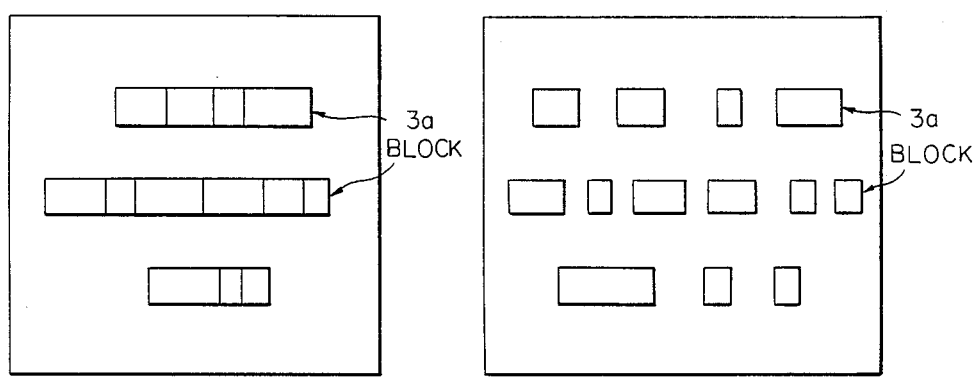
FIGS. 7A and 7B illustrate a wiring example of an LSI model.

FIG. 7A shows an example of the initial location in which blocks 3a are placed to minimize wiring length. For that reason, the blocks are placed in a center region of an LSI concentrically. On the other hand, in FIG. 7B which shows a relocation of them according to the present invention, the blocks are interleaved with a plurality of empty cells the number of which is calculated according to the present invention. Therefore, the wiring length in the relocation shown in FIG. 7B is increased slightly compared with that in the initial location shown in FIG. 7A. However, since the relocation shown in FIG. 7B is obtained on the basis of the initial location shown in FIG. 7A in which is optimum so long as the wiring length is concerned, the increase in the wiring length in the relocation does not affect substantially.

Wirings between two cell rows shown in FIGS. 7A and 7B will be described in detail with reference to FIGS. 8A and 8B.

In a region around the center portion of the LSI, there are, in addition to a first wiring layer extending horizontally between adjacent cell rows, a number of second wiring layers extending vertically over a plurality of cell rows. In order to prevent short-circuit from occuring between them and block terminals 4b and wirings in blocks 4a, they can not pass through over the terminals 4b and prohibited regions in the blocks. Therefore, the wirings must be provided on wiring grids in the blocks 4a which satisfy the above-mentioned condition or on wiring grids of empty cell portion on which the blocks 4a are not placed.

Figure 8A:
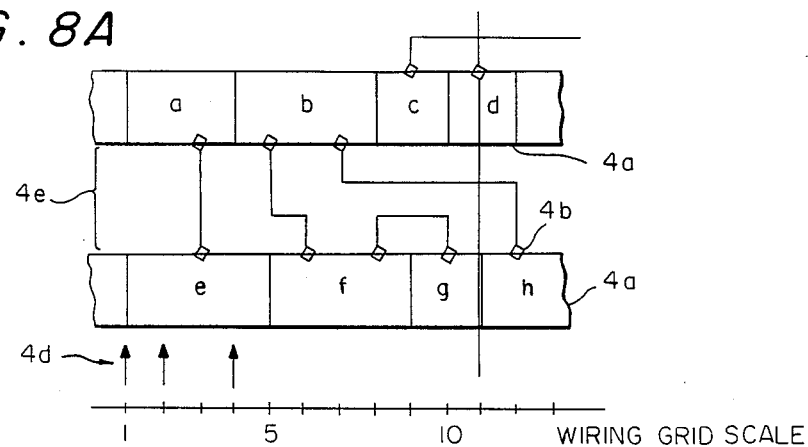
FIGS. 8A and 8B illustrate an example of wirings around a center portion of an LSI model.

In the wiring shown in FIG. 8A, the wirings for closely placed blocks a to h are provided in a wiring region 4e between the cell rows. Further, since a number of terminals 4b are used, only columns 1, 2 and 4 on the wiring grid scale are available as empty tracks satisfying the above condition for the second layer of wirings covering the two cell rows, as shown by upward arrows 4d.

Therefore, if four or more vertical wirings are required, the excess wirings must be done in empty tracks in a left side of the blocks a and e or in empty tracks in a right side of the blocks d and h.

When such bypass routes are used, a new horizontal wiring requirement occurs in the first layer, which is unnecessary heretofore. When a capacity of the horizontal wiring region of the first layer is not enough, there may be non-wired portions left as they are.

Figure 9:
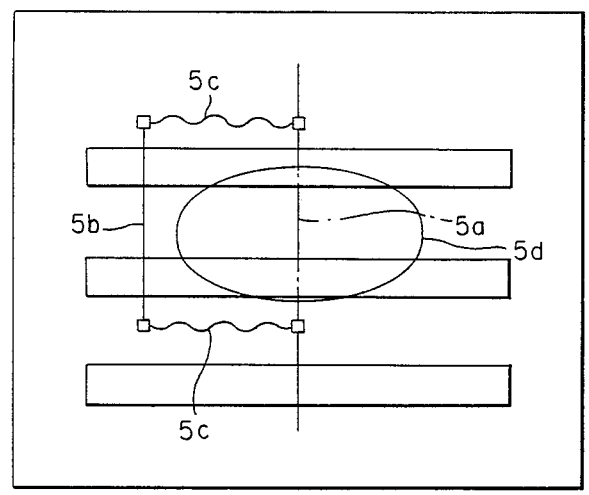
FIG. 9 illustrates an example in which additional wiring requirements are made when an initial location result is used as it is.

Describing this in detail with reference to FIG. 9, a vertical line 5a is optimum in length when it passes through a center portion 5d of an LSI. However, it is usual that, as a result of placement, blocks are placed in the center portion 5d concentrically and so there is no empty track for vertical wiring requirement in that portion. Therefore, a search is performed from the wiring requirement 5a in both sides thereof and an empty track outside the region 5d is assigned as a wiring track 5b. In order to provide a connection channel from a block terminal to another block terminal by using the wiring track 5b, new horizontal wiring requirement 5c occurs. Therefore, in a route consisting of the lines 5b and 5c, there may be a case where a predetermined wiring capacity is exceeded thereby. As a result, instead of an automatic wiring controlled by a computer, a wiring design must be performed manually with a relocation of blocks on cells.

Figure 8B:
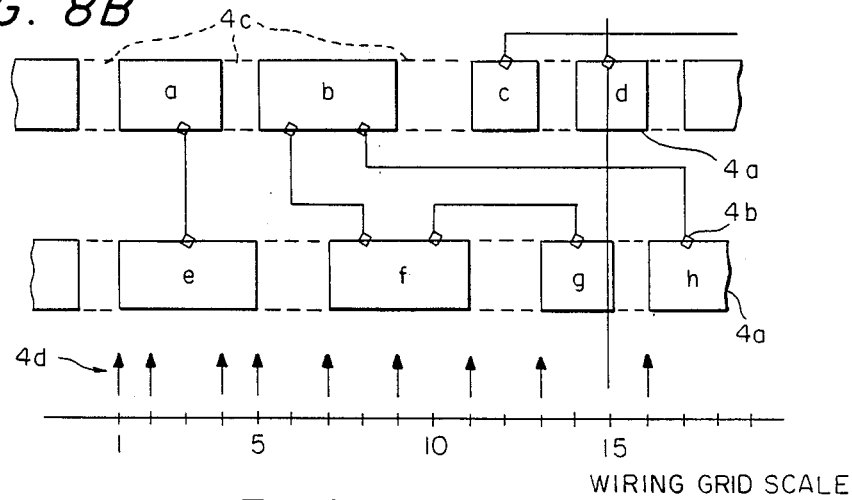

In FIG. 8B, the arrangement in FIG. 8A is improved by inserting the empty cells 4c between the blocks 4a. Therefore, in FIG. 8B, there are nine empty tracks 4d provided which satisfy the vertical wiring requirement of the second layer penetrating the two cell rows, as shown by columns 1, 2, 4, 5, 7, 9, 11, 13 and 16 on the wiring grid scale.

As a result, the vertical wiring requirement required in the placement in FIG. 8A, for example, the vertical wiring requirement on a column 11 of the wiring grid, can be satisfied in the placement in FIG. 8B.

In addition thereto, it becomes unnecessary to respond to the requirement of horizontal wiring requirement of the first layer which is required as the bypass channel, resulting in a reduction of the number of horizontal wiring in the first layer.

Although the embodiment of the present invention has been described as to the LSI of the master slice type, the present invention can be applied to LSI or printed circuit board of other types.

According to the present invention, since the relocation of the blocks are performed prior to the global router and vertical assignment, it becomes unnecessary to repeat these procedures. Further, according to the present invention, empty tracks for wirings can be retained so that a relocation of blocks becomes unnecessary.

What is claimed is:

1. A layout placement method for a wiring grid with a plurality of cell rows, separated by wiring regions, each cell row having a plurality of cells, the method comprising the steps of:
   (a) for each cell row inputting to a logic connection information file a number and type of variable size blocks, each block containing an integral number of cells and reading from a preprogrammed library a required number of cells for each block type input for a row,
   (b) inputting to the logic connection information file a number of block terminals for each block,
   (c) counting a number of empty cells of each cell row,
   (d) calculating a number of required empty cells for each row from the number of blocks, the number of block terminals and the number of empty cells, by:
      (i) determining an average cell row terminal density equal to the total number of terminals in the cell row divided by the total number of cells in the cell row, and
      (ii) determining the number of required empty cells for a block by finding the difference between the number of block terminals in the cell row divided by the average terminal density of the cell row and the number of cells in the block,
   (e) calculating for each row one of an excess and deficiency of the required empty cells from the difference between the number of empty cells and the number of required empty cells,
   (f) distributing blocks on the wiring grid to compensate for the calculated one of the excess and deficiency, and
   (g) locating the distributed blocks on a base structure of the wiring grid.

2. The method of claim 1 further comprising the steps of:
   locating variable length blocks in sequence from a first end to a second end along a cell row,
   locating empty cells not distributed to blocks on a first end of the cell row,
   locating empty cells distributed to a block on a second end of the block, and
   shifting blocks along the cell row to accommodate the location of empty cells.

3. The method of claim 1 further comprising interconnecting block terminals after said locating step.

4. The method of claim 1 wherein the wiring grid comprises a model for a semiconductor device.

5. The method of claim 1 wherein the wiring grid comprises a model for a printed circuit.

6. The method of claim 1 wherein the wiring grid comprises a model for an LSI circuit.

7. The method of claim 1 wherein the wiring grid comprises a model for a VLSI circuit.

8. A layout placement method for a wiring grid with a plurality of cell rows, separated by wiring regions, each cell row having a plurality of cells, the method comprising the steps of:
   (a) for each cell row inputting to a logic connection information file a number and type of variable size blocks, each block containing an integral number of cells and reading from a preprogrammed library a required number of cells for each block type input for a row, wherein each block begins with a non-empty cell and includes an integral number of adjacent cells to the beginning of the next block,
   (b) inputting to the logic connection information file a number of block terminals for each block,
   (c) counting a number of empty cells of each cell row,
   (d) calculating a number of required empty cells for each row from the number of blocks, the number of block terminals and the number of empty cells, by:
      (i) determining an average cell row terminal density equal to the total number of terminals in the cell row divided by the total number of cells in the cell row, and
      (ii) determining the number of required empty cells for a block by finding the difference between the number of block terminals in the cell row divided by the average terminal density of the cell row and the number of cells in the block,
   (e) calculating for each row one of an excess and deficiency of the required empty cells from the difference between the number of empty cells and the number of required empty cells,
   (f) distributing blocks on the wiring grid to compensate for the calculated one of the excess and deficiency, and
   (g) locating the distributed blocks on a base structure of the wiring grid,
   (h) maintaining a record containing for each block in a cell row the number of empty cells, the number of required empty cells, the excess and deficiency of empty cells, and further containing a number of empty cells located at a first end of the cell row before the first cell in the first block, and
   (i) distributing empty cells at the first end of the cell row to each block having a deficiency of empty cells.

9. The method recited in claim 8 further comprising the steps of:
   locating variable length blocks in sequence from a first end to a second end along a cell row,
   locating empty cells not distributed to blocks on a first end of the cell row,
   locating empty cells distributed to a block on a second end of the block, and
   shifting blocks along the cell row to accommodate the location of empty cells.

10. The method of claim 8 further comprising interconnecting blocks terminals after said locating step.

11. The method of claim 8 wherein the wiring grid comprises a model for at least one of a semiconductor device, a printed circuit, an LSI circuit, and a VLSI circuit.

* * * * *